US006762131B2

United States Patent
Lim et al.

(12) United States Patent
(10) Patent No.: US 6,762,131 B2
(45) Date of Patent: Jul. 13, 2004

(54) METHOD FOR LARGE-SCALE FABRICATION OF ATOMIC-SCALE STRUCTURES ON MATERIAL SURFACES USING SURFACE VACANCIES

(75) Inventors: Chong Wee Lim, Urbana, IL (US); Kenji Ohmori, Urbana, IL (US); Ivan Georgiev Petrov, Champaign, IL (US); Joseph E. Greene, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 10/123,031

(22) Filed: Apr. 13, 2002

(65) Prior Publication Data

US 2003/0194875 A1 Oct. 16, 2003

(51) Int. Cl.[7] ................... H01L 21/302; H01L 21/461; H01L 21/31
(52) U.S. Cl. ................... 438/719; 438/597; 438/735; 438/795
(58) Field of Search .................... 438/719, 597, 438/689, 735, 738, 795, 974

(56) References Cited

U.S. PATENT DOCUMENTS

| 6,010,831 A | * | 1/2000 | Hatakeyama et al. ....... 430/323 |
| 6,274,234 B1 | | 8/2001 | Dujardin et al. |
| 6,294,450 B1 | | 9/2001 | Chen et al. |
| 6,314,019 B1 | | 11/2001 | Kuekes et al. |
| 6,319,566 B1 | * | 11/2001 | Polanyi et al. ............... 427/533 |
| 6,444,533 B1 | * | 9/2002 | Lyding et al. ............... 438/308 |
| 6,546,788 B2 | * | 4/2003 | Magerle ....................... 73/105 |

OTHER PUBLICATIONS

Becker, Atomic scale surface modifications using a tunneling microscope, 1987.*
Dagata et al, Modification of Hydrogen Passivated Si by STM, 1990.*
J. S. Foster et al., "Molecular manipulation using a tunneling microscope", Nature 331, 324 (1988).
D. M. Eigler et al., "Positioning single atoms with a scanning tunneling microscope", Nature 344, 524 (1990).
In–Whan Lyo et al., "Field–induced nanometer–to atomic–scale manipulation of silicon surfaces with the STM", Science 253, 173 (1991).
M. F. Crommie et al., "Confinement of electrons to quantum corrals on a metal surface", Science 262, 218 (1993).

(List continued on next page.)

Primary Examiner—Alexander Ghyka
(74) Attorney, Agent, or Firm—Greer, Burns & Crain, Ltd.

(57) ABSTRACT

A method for forming atomic-scale structures on a surface of a substrate on a large-scale includes creating a predetermined amount of surface vacancies on the surface of the substrate by removing an amount of atoms on the surface of the material corresponding to the predetermined amount of the surface vacancies. Once the surface vacancies have been created, atoms of a desired structure material are deposited on the surface of the substrate to enable the surface vacancies and the atoms of the structure material to interact. The interaction causes the atoms of the structure material to form the atomic-scale structures.

22 Claims, 3 Drawing Sheets

OTHER PUBLICATIONS

R. S. Becker et al., "Atomic–scale surface modifications using a tunneling microscope", *Nature* 325, 419 (1987).

J. A. Dagata et al., "Modification of hydrogen–passivated silicon by a scanning tunneling microscope operating in air", *Appl. Phys. Lett. 56* (20), 2001 (1990).

R. S. Becker et al., "Atomic scale conversion of clean Si(111):H–1×1 to Si (III) –2×1 by electron–stimulated desorption", *Phys. Rev. Lett.* 65, 1917 (1990).

J. W. Lyding et al., "Nanoscale patterning and oxidation of H–passivated Si(100)–2×1 surfaces with an ultrahigh vacuum scanning microscope",*Appl. Phys. Lett. 64* (15), 2010 (1994).

J. W. Lyding et al., "Ultrahigh vacuum–scanning tunneling microscopy nanofabrication and hydrogen/deuterium desorption from silicon surfaces: implications for complementary metal oxide semiconductor technology", *Applied Surface Science 130–132* (1998) 221–230.

C. Preinesberger et al., "Formation of dysprosium silicide wires on Si(001)", *J. Phys. D: Appl. Phy. 31* (1998), L43–L45.

Yong Chen et al., "Epitaxial growth of erbium silicide nanowires on silicon (001)", *Materials Science and Engineering B87* (2001), 222–226.

L.J. Guo and S.Y. Chou, "Stacked quantum dot transistor and charge inducted confinement enhancement" *Electronics Letters*, May 14, 1998, vol. 34, No. 10, p. 1030.

Lingjie Guo, Effendi Leobandung, Stephen Y. Chuo, "A Silicon Single–Electron Transistor Memory Operating at Room Temperature", *Science*, vol. 275, Jan. 31, 1997, p. 649–651.

"Quantum transistors: toward nanoelectronics", *IEEE Spectrum*, Sep. 2000, p. 46–51.

"Solid State", *IEEE Spectrum*, Jan. 1997, p. 55–59.

\* cited by examiner

METHOD FOR LARGE-SCALE FABRICATION OF ATOMIC-SCALE STRUCTURES ON MATERIAL SURFACES USING SURFACE VACANCIES

STATEMENT OF GOVERNMENTAL INTEREST

This invention was made with Government support under contract Number DEFG02-ER-45439 awarded by the United States Department of Energy. The Government has certain fights in the invention.

FIELD OF INVENTION

The present invention generally relates to processes for atomic-scale modification of surfaces, and more particularly to methods for fabricating atomic-scale structures on a surface of a material on a large-scale with atomic precision.

BACKGROUND

Atomic-scale modification of material surfaces has been demonstrated since the late 1980's with the advent of the scanning tunneling microscope (STM). Initially, the STM had been used to obtain atomic-resolution images of surfaces, but later, the STM has also been used for atomic-scale modification of surfaces. The STM includes a conducting needle which is held close to a conducting surface. By adjusting the position and the voltage applied to the tip of the needle, individual or cluster of atoms are removed from the surface and deposited on the STM tip. The tip is then moved to a predetermined surface site and the atoms are redeposited.

Over the years various techniques, including direct manipulation of atoms through UHV (ultrahigh vacuum)-STM tips, nano-patterning by changing local chemical-state of surfaces, etc., have been proposed to achieve device miniaturization. These known techniques, however, have not been utilized for industrial applications. This is primarily due to the fact that these techniques can only modify very localized area (generally tens of nanometers). The STM-based technique is also an extremely slow process, which requires one-by-one positioning of each individual or clusters of atoms. The traveling speed of the STM tip is typically about 0.4 nm/s, therefore it would require enormous amount of time (months) to scan just one piece of an 8-inch Si wafer. These known STM-based techniques may be useful for scientific studies on growth of atomic-scale structures at a small-scale. However, they are not appropriate as a large-scale manufacturing technique for the use in the semiconductor industry.

SUMMARY OF THE INVENTION

The present invention relates to a method for forming atomic-scale structures on a surface of a substrate on a large-scale. The method includes creating a predetermined amount of surface vacancies on the surface of the substrate by removing an amount of atoms on the surface of the material corresponding to the predetermined amount of surface vacancies. Once the surface vacancies have been created, atoms of a desired structure material are deposited on the surface of the substrate to enable the surface vacancies and the atoms of the structure material to interact. This interaction causes the atoms of the structure material to form the atomic-scale structures.

DETAILED DESCRIPTION OF THE INVENTION

Figure 1:
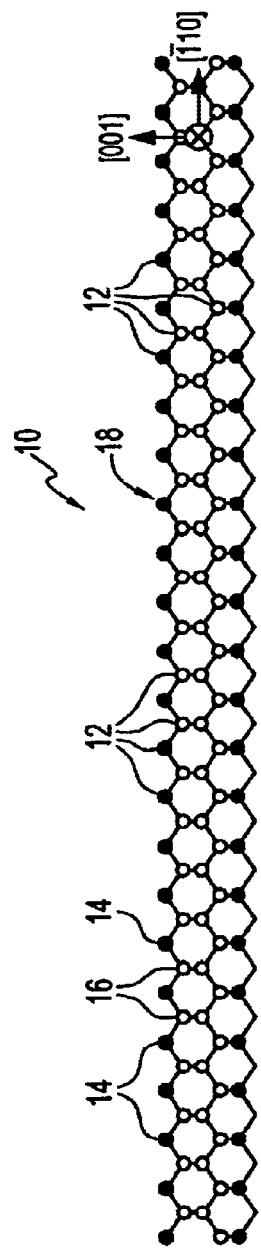
FIG. 1 is a sectional view of a substrate material prior to the formation of surface vacancies in accordance with embodiments of the present invention.
Figure 2:
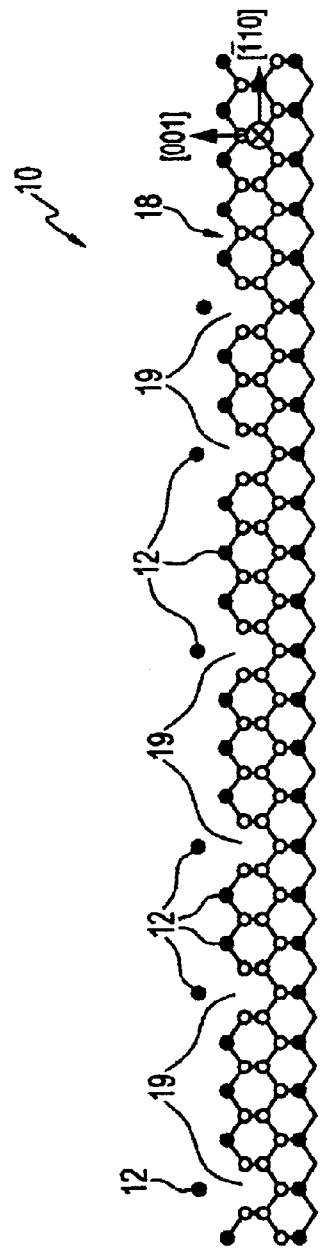
FIG. 2 is a sectional view of the substrate material of FIG. 1, showing surface vacancies formed in accordance with embodiments of the present invention.

Turning to FIGS. 1–2, a method of fabricating atomic-scale structures on a material surface in accordance with embodiments of the present invention is described. In FIG. 1, a section of a material substrate 10, a Si substrate, for example, is shown in <110> zone axis (a sectional view), and has layers of Si atoms 12 including a first monolayer 14 and a second monolayer 16 extending along the surface 18. In accordance with one embodiment of the present invention, the surface 18 undergoes a reactive plasma etching process, preferably using predetermined partial pressure $O_2$ sufficient to remove atoms 12 from the surface 18 of the substrate 10 and create surface vacancies 19 at the locations evacuated by surface atoms 12 (best shown in FIG. 2). Other gases such as $Cl_2$, $F_2$, HF, $CFCl_3$, $CF_2Cl_2$, $CCl_4$, $BCl_3/Cl_2$, $CF_4/O_2$, $SF_6$, and $NF_3$, for example, are also suitable for the plasma etching process.

Using higher partial pressure of gas results in more surface atoms 12 from being removed from the surface 18, thereby creating corresponding number of surface vacancies 19. Lower partial pressure gas has the opposite effect. Accordingly, partial pressure can be ranging from tens of $mT(10^{-3}$ Torr) to $10^{-10}$ Torr. For example, experiments have shown that in a Si substrate 10 having approximately 3% surface vacancies per square centimeter ($1.017 \times 10^{13}$ dimers vacancies per $cm^{-2}$) before the $O_2$ etching process, the percentage of surface vacancies increased to 15% ($5.085 \times 10^{13}$ dimers vacancies per $cm^{-2}$) at $O_2$ exposure of 2.5L (where $1L = 1.33 \times 10^{-6}$ Torr×1 s), and to 30% ($1.017 \times 10^{14}$ dimers vacancies per $cm^{-2}$) at $O_2$ exposure of 10.0L. It should be noted that these results were obtained with the substrate temperature at 700° C.

Figure 3:
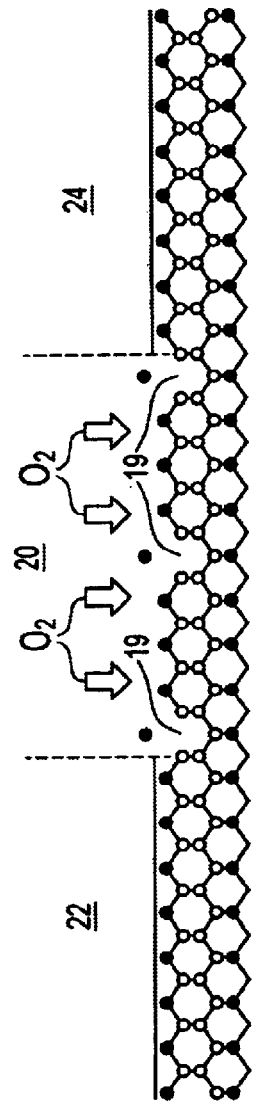
FIGS. 3 and 4 are sectional views of a substrate material illustrating a method for controlling the amount of surface vacancies that are formed on different areas on the surface of the substrate material.
Figure 4:
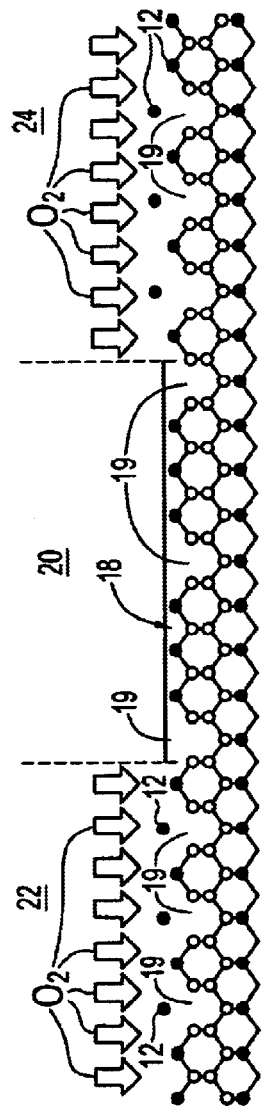

Turning now to FIGS. 3 and 4, conventional lithography and isolation techniques (e.g. LOCOS or STI) may be employed to define or pattern areas that require different orientation and distribution of atomic-scale structures, (if desired and/or necessary), in conjunction with reactive plasma etching process. In FIG. 3, for example, only an area 20 of the surface 18 is subjected to a low partial pressure $O_2$ etching gas, while adjacent areas 22, 24 are protected or masked from the $O_2$ etching gas by a photoresist. As a result, a number of the Si atoms 12 in only this area 20 are removed from the surface 18.

Turning to FIG. 4, the area 20 etched with low partial pressure $O_2$ gas is now masked from the $O_2$ etching gas, and adjacent areas 22, 24 are exposed to a higher partial pressure $O_2$ etching gas than in the area 20. As a result, the areas 22, 24 that are exposed to the higher partial pressure $O_2$ etching gas have a higher percentage of surface vacancies than the area 20 exposed to the lower partial pressure gas.

Figure 5:
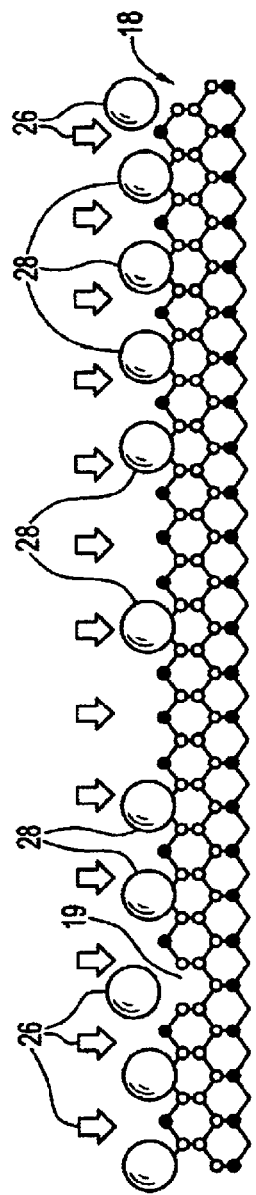
FIG. 5 is a sectional view of the substrate material with atomic-scale structures formed on the surface, generally showing a method for forming atomic-scale structures on the surface of the substrate material in accordance with an embodiment of the present invention; and, FIG. 6 is a plan view of the substrate material with atomic-scale structures of FIG. 5, generally showing the atomic-scale structures formed on the surface of the substrate material.
Figure 6:
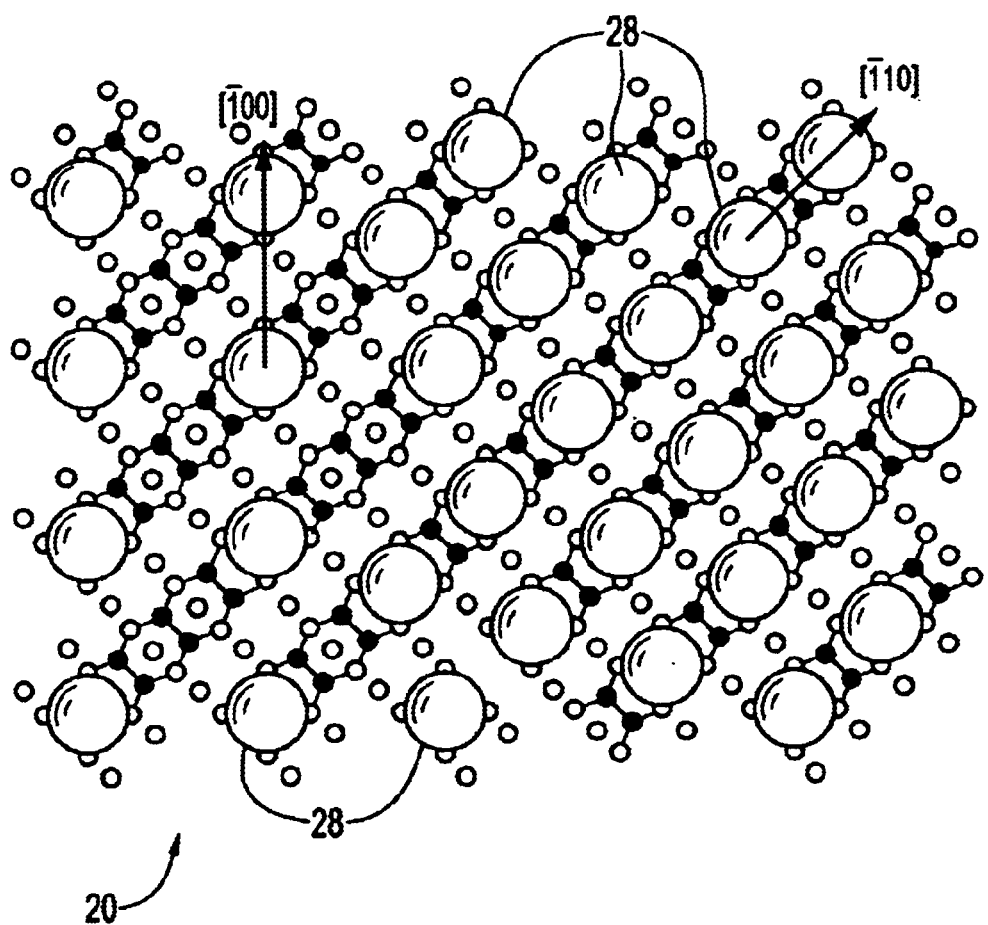

Turning now to FIGS. 5 and 6, after the surface 18 has been etched, as shown in FIG. 2 or 4, blanket deposition of atoms 26 of desired material, such as Er atoms, for example, is carried out simultaneously on surface 18 at predetermined temperatures, to form atomic-scale structures 28 on the entire surface. In experiments in which Er atoms were deposited on a Si substrate 10, for example, the deposition was performed at a substrate's temperatures of approximately 700° C. It should be understood, however, that the substrate's temperature required can vary significantly from about room temperature to upwards of approximately 1,500° C., depending on the type of substrate and atomic-scale structures to be formed. For example, the temperature required for forming W atomic-scale structures on the Si substrate 10 would be much higher than the temperature required to form Er atomic-scale structures.

The deposited atoms 26 react with the surface vacancies 19 created. The interaction and bonding relationship between the deposited materials and substrate results in the formation of atomic-scale structures in a self-assembly manner. The distribution and orientation of these atomic-scale structures 28 on a specific area generally correspond to those of the surface vacancies 19.

Experimental results show that specific bonding relationship is established during the formation of atomic-scale structures. This bonding relationship varies from materials to materials and can be controlled by the amount of surface vacancies. For example, in the case of Er atoms deposited on Si(001) substrate with ~25% of surface vacancies. Rearrangement of surface vacancies occurs upon annealing at 700C and its interaction with Er atoms results in the formation of regular array of Er atomic-scale structures. With this specific condition, the Er atomic-scale structures are formed on top of the vacancies sites with six Si atoms surrounding them. A minimum spacing of 1.086 nm is measured between the atomic-scale structures along [100] direction.

In accordance with another embodiment of the present invention, the surface vacancies 19 on the surface 18 of the substrate 10 (best shown in FIG. 2) are created through high temperature annealing in a vacuum chamber (not shown). In this embodiment, the substrate 10 is placed in a vacuum chamber at predetermined pressure and temperature for a predetermined time period. In experiments using Si substrate 10, for example, the desired amount of surface vacancies 19 were created at about 1,100° C. and at a pressure of $5 \times 10^{-10}$ Torr for 180 second. It should be understood, however, that the parameters for creating specific amount of surface vacancies can vary widely depending on the choice of substrate material. The pressure can range anywhere from about $10^{-3}$ T to about $10^{-10}$ T, the temperature can be anywhere from room temperature to 1,500° C., and the length of time from few seconds to hours.

It should be understood that other methods can be employed to create surface vacancies 19 on the material surface 18 in addition to the two described above, ion-sputtering, for example. Also, while the present invention has been described using Er as an example for forming the atomic-scale structures 28 on a Si substrate 10, it should be understood that the methods described above is applicable to many other suitable combinations of materials. Some examples of materials for use as the substrate 10 include SiGe, SiC, Ge, GaAs, GaAlAs, GaAlAsP, etc., and the atomic-scale structures 28 can be formed from almost any known elements and compounds including rare-earth metal (e.g. Gd, Er, Dy, Yb etc.), Group IV elements (e.g. C, Ge, Si, Sn etc.), transition metals (e.g. Co, Ni, Ti, Cu etc.) and many other organic materials. The parameters specified above for creating and controlling the amount of surface vacancies 19 and for depositing atoms for forming atomic-scale structures 28 on the substrate surface 18 may be changed accordingly for different materials systems.

In accordance with another embodiment of the present invention, at least one additional layers of atomic-scale structures of different materials can be formed on top of the previously formed layer of atomic-scale structures 28. This is accomplished by treating the previous layer of the atomic-scale structure 28 as a substrate and forming the additional layer on the surface of the previously formed atomic-scale structure 28 in the same manner described above for forming the previously formed atomic-scale structure 28.

From the foregoing description, it should be understood that an improved method for forming atomic-scale structures on a surface material on a large-scale has been shown and described which has many desirable attributes and advantages. Predetermined amount of surface vacancies are created on the surface of the material and atoms of desired materials are deposited on the modified surface to form the atomic-scale structures.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for forming atomic-scale structures on a surface of a substrate on a large-scale, said method comprising the steps of:

creating a predetermined amount of surface vacancies on the surface of the substrate by a reactive gas etching process to remove an amount of atoms on the surface of the substrate corresponding to said predetermined amount of surface vacancies; and, depositing atoms of a desired structure material on the surface of the substrate to enable said surface vacancies and said atoms of said structure material to interact, said interaction causing said atoms of said structure material to form the atomic-scale structures.

2. The method as defined in claim 1 wherein any one of $O_2$, $Cl_2$, $F_2$, HF, $CFCl_3$, $CF_2Cl_2$, $CCl_4$, $BCl_3/Cl_2$, $CF_4/O_2$, $SF_6$, and $NF_3$ gas is used in said reactive gas etching process.

3. A The method as defined in claim 1 wherein said atoms of said structure material are deposited on the substrate through a blanket deposition process.

4. A method for forming atomic-scale structures on a surface of a substrate on a large scale, said method comprising the steps of:

creating a first predetermined amount of surface vacancies on a first select area on the surface of the substrate by removing an amount of atoms on said first select area corresponding to said first predetermined amount;

creating a second predetermined amount of surface vacancies on at least one other select area on the surface of the substrate by removing a second amount of atoms on said at least one other select area of the surface of the substrate corresponding to said second predetermined amount; and, depositing atoms of a desired structure material on the surface of the substrate to enable said surface vacancies on said first select area and said at least one other select area, and said atoms of said structure material to interact, said interaction causing said atoms of said structure material to form the atomic-scale structures.

5. The method as defined in claim 4 wherein said surface vacancies in said first select area and said at least one other select area are created by a reactive gas etching process.

6. The method as defined in claim 5 further including the steps of blocking exposure of said at least one other select area to said reactive gas etching process when said surface vacancies are being created in said first select area, and said first select area to said reactive gas etching process when said surface vacancies are being created in said at least one other select area.

7. The method as defined in claim 5 wherein any one of $O_2$, $Cl_2$, $F_2$, HF, $CFCl_3$, $CF_2Cl_2$, $CCl_4$, $BCl_3/Cl_2$, $CF_4/O_2$, $SF_6$, and $NF_3$ gas is used in said reactive gas etching process.

8. A method for forming atomic-scale structures on a semiconductor substrate on a large scale, said method comprising the steps of:

creating a predetermined amount of surface vacancies on a surface of the semiconductor substrate by a reactive gas etching process to remove an amount of atoms on said surface of the substrate corresponding to said predetermined amount of said surface vacancies; and, depositing atoms of a desired structure material on the surface of the substrate to enable said surface vacancies and said atoms of said structure material to interact, interaction causing said atoms of said structure material to form the atomic-scale structures.

9. The method as defined in claim 8, wherein said semiconductor substrate is any one of Si, SiGe, SiC, Ge, GaAs, GaP, AlAs, AlP, GaAlAs, GaAlAsP and any other combination of Group III, IV, V elements.

10. The method as defined in claim 8 wherein any one of $O_2$, $Cl_2$, $F_2$, HF, $CFCl_3$, $CF_2Cl_2$, $CCl_4$, $BCl_3/Cl_2$, $CF_4/O_2$, $SF_6$, and $NF_3$ gas is used in said reactive gas etching process.

11. The method as defined in claim 1 wherein said atoms of said structure material are deposited on the surface of the substrate through a blanket deposition process.

12. A method for forming a plurality of layers of atomic-scale structures on a surface of a substrate on a large-scale, said method comprising the steps of:

creating a predetermined amount of first surface vacancies on the surface of the substrate by removing an amount of atoms on the surface of the substrate corresponding to said predetermined amount of first surface vacancies;

depositing atoms of a first desired structure material on the surface of the substrate to enable said first surface vacancies and said atoms of said first structure material to interact, said interaction causing said atoms of said first structure material to form a first layer of the atomic-scale structures;

creating a predetermined amount of second surface vacancies on a surface of said first layer by removing an amount of atoms on the surface of said first layer corresponding to said predetermined amount of second surface vacancies; and, depositing atoms of a second desired structure material on said surface of said first layer to enable said second surface vacancies and said atoms of said second structure material to interact, said interaction causing said atoms of said second structure material to form a second layer of the atomic-scale structures.

13. A method for forming atomic-scale structures on a surface of a substrate on a large-scale, said method comprising the steps of:

creating a predetermined amount of surface vacancies on the surface of the substrate in a vacuum chamber by a high temperature annealing process to remove an amount of atoms on the surface of the substrate corresponding to said predetermined amount of surface vacancies; and, depositing atoms of a desired structure material on the surface of the substrate to enable said surface vacancies and said atoms of said structure material to interact, said interaction causing said atoms of said structure material to form the atomic-scale structures.

14. A method for forming atomic-scale structures on a surface of a substrate on a large-scale, said method comprising the steps of:

creating a predetermined amount of surface vacancies on the surface of the substrate by an ion sputtering process to remove an amount of atoms on the surface of the substrate corresponding to said predetermined amount of surface vacancies; and, depositing atoms of a desired structure material on the surface of the substrate to enable said surface vacancies and said atoms of said structure material to interact, said interaction causing said atoms of said structure material to form the atomic-scale structures.

15. A method for forming atomic-scale structures on a semiconductor substrate on a large scale, said method comprising the steps of:

creating a predetermined amount of surface vacancies on the surface of the substrate in a vacuum chamber by a high temperature annealing process to remove an amount of atoms on the surface of the substrate corresponding to said predetermined amount of surface vacancies; and, depositing atoms of a desired structure material on the surface of the substrate to enable said surface vacancies and said atoms of said structure material to interact, said interaction causing said atoms of said structure material to form the atomic-scale structures.

16. A method for forming atomic-scale structures on a semiconductor substrate on a large scale, said method comprising the steps of:

creating a predetermined amount of surface vacancies on the surface of the substrate by an ion sputtering process to remove an amount of atoms on the surface of the substrate corresponding to said predetermined amount of surface vacancies; and, depositing atoms of a desired structure material on the surface of the substrate to enable said surface vacancies and said atoms of said structure material to interact, said interaction causing said atoms of said structure material to form the atomic-scale structures.

17. A method for forming atomic-scale structures on a surface of a substrate on a large-scale, said method comprising the steps of:

creating a predetermined amount of surface vacancies in a parallel process on the surface of the substrate by removing in parallel an amount of atoms on the surface of the substrate corresponding to said predetermined amount of surface vacancies; and, depositing atoms of a desired structure material on the surface of the substrate to enable said surface vacancies and said atoms of said structure material to interact, said interaction causing said atoms of said structure material to form the atomic-scale structures.

18. The method as defined in claim 17 wherein said surface vacancies are created by a reactive gas etching process.

19. The method as defined in claim 18 wherein any one of $O_2$, $Cl_2$, $F_2$, HF, $CFCl_3$, $CF_2Cl_2$, $CCl_4$, $BCl_3/Cl_2$, $CF_4/O_2$, $SF_6$, and $NF_3$ gas is used in said reactive gas etching process.

20. The method as defined in claim 17 wherein said surface vacancies are created in a vacuum chamber by a high temperature annealing process.

21. The method as defined in claim 17 wherein said surface vacancies are created by an ion sputtering process.

22. The method as defined in claim 17 wherein said atoms of said structure material are deposited on the substrate through a blanket deposition process.

* * * * *